US011923860B2

United States Patent
Tsuji

(10) Patent No.: US 11,923,860 B2
(45) Date of Patent: Mar. 5, 2024

(54) PLL CIRCUIT

(71) Applicant: ROHM CO., LTD., Kyoto (JP)

(72) Inventor: Masanobu Tsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/831,788

(22) Filed: Jun. 3, 2022

(65) Prior Publication Data

US 2022/0302919 A1  Sep. 22, 2022

Related U.S. Application Data

(63) Continuation of application No. PCT/JP2020/044205, filed on Nov. 27, 2020.

(30) Foreign Application Priority Data

Dec. 5, 2019  (JP) .................................. 2019-220372

(51) Int. Cl.
*H03L 7/099* (2006.01)
*H03L 7/081* (2006.01)

(52) U.S. Cl.
CPC ............ *H03L 7/0995* (2013.01); *H03L 7/081* (2013.01); *H03L 7/0992* (2013.01); *H03L 2207/50* (2013.01)

(58) Field of Classification Search
CPC ..... H03L 7/00; H03L 7/06; H03L 7/08; H03L 7/099; H03L 7/0991; H03L 7/0992; H03L 7/0993; H03L 7/0995; H03L 7/0996; H03L 7/0997; H03L 7/0998; H03L 7/24
See application file for complete search history.

(56) References Cited

U.S. PATENT DOCUMENTS

| 10,153,728 B2* | 12/2018 | Cho ...................... H01F 38/14 |
| 2012/0062293 A1* | 3/2012 | Liang ...................... H03L 7/23 |
| | | 327/156 |

FOREIGN PATENT DOCUMENTS

JP  2014154973 A  8/2014

OTHER PUBLICATIONS

Ahmad et al., "A 0.5-9.5-GHz, 1.2-µs Lock-Time Fractional-N DPLL With ±1.25%UI Period Jitter in 16-nm CMOS for Dynamic Frequency and Core-Count Scaling", IEEE Journal of Solid-State Circuits, vol. 52, No. 1, Jan. 2017; pp. 21-32.

(Continued)

*Primary Examiner* — Diana J. Cheng
(74) *Attorney, Agent, or Firm* — CANTOR COLBURN LLP

(57) ABSTRACT

A DCO is configured such that, during a period in which a selection signal is asserted, a ring oscillator is formed so as to oscillate at a frequency that corresponds to a control code, and such that, during a period in which the selection signal SEL is negated, an injection edge based on a reference clock can be injected. During the startup period of a PLL circuit, a controller repeats a cycle including (i) a process in which the selection signal is asserted so as to oscillate the DCO, and phase comparison is made between an oscillator clock and the reference clock, and (ii) a process in which the selection signal is negated so as to stop the DCO, and the control code is updated by a binary search based on a result of the phase comparison.

8 Claims, 12 Drawing Sheets

(56) References Cited

OTHER PUBLICATIONS

Chung et al., "A Fast Phase Tracking ADPLL for Video Pixel Clock Generation in 65 nm CMOS Technology", IEEE Journal of Solid-State Circuits, vol. 46, No. 10, Oct. 2011; pp. 2300-2311.

Ho et al., "A Low-Jitter Fast-Locked All-Digital Phase-Locked Loop With Phase-Frequency-Error Compensation", IEEE Transactions on Very Large Scale Integration (VLSI) Systems, vol. 24, No. 5, May 2016; pp. 1984-1992.

Höppner et al., "A Fast-Locking ADPLL With Instantaneous Restart Capability in 28-nm CMOS Technology", IEEE Transactions on Circuits and Systems—II: Express Briefs, vol. 60, No. 11, Nov. 2013; pp. 741-745.

Lin et al., "A Fast-Locking All-Digital Phase-Locked Loop With Dynamic Loop Bandwidth Adjustment", IEEE Transactions on Circuits and Systems—I: Regular Papers, vol. 62, No. 10, Oct. 2015; pp. 2411-2422.

Okuno et al., "A 2.23 ps RMS Jitter 3 µs Fast Settling ADPLL using Temperature Compensation PLL Controller", IEEE, 2014, pp. 68-71.

Okuno et al., "Temperature Compensation using Least Mean Squares for Fast Settling All-Digital Phase-Locked Loop", IEEE; 2013; 4 pages.

International Search Report for International Application No. PCT/JP2020/044205; dated Jan. 19, 2021; PCT IPRP for International Application No. PCT/JP2020/044205; Date of Mailing, May 17, 2022; and PCT Written Opinion of the International Searching Authority or International Application No. PCT/JP2020/044205; dated Jan. 19, 2021.

Rahman et al., "A 1-2 GHz Computational-Locking ADPLL With Sub-20-Cycle Locktime Across PVT Variation", IEEE Journal of Solid-State Circuits, 2019; pp. 1-14.

Shen et al., "A 0.17-to-3.5mW 0.15-to-5GHz SoC PLL with 15dB Built-In Supply Noise Rejection and Self-Bandwidth Control in 14nm CMOS", IEEE International Solid-State Circuits Conference, Session 19, Digital PLLs; 19.4, Feb. 3, 2016; pp. 330-332.

Staszewski et al., "All-Digital PLL With Ultra Fast Settling", IEEE Transactions on Circuits and Systems—II: Express Briefs, vol. 54, No. 2, Feb. 2007; pp. 181-185.

Wu et al., "A Two-Cycle Lock-In Time ADPLL Design Based on a Frequency Estimation Algorithm", IEEE Ransactions on Circuits and Systems—II: Express Briefs, vol. 57, No. 6, June 2010; pp. 430-434.

\* cited by examiner

FIG. 4

| Output | 0 | 1 | 2 | 3 | 4 | 5 | 6 | 7 | 8 | 9 | 10 | 11 | 12 | 13 | 14 | 15 | | |
|---|---|---|---|---|---|---|---|---|---|---|---|---|---|---|---|---|---|---|
| 4th cycle | | | | | | | | | | | | | | | | 1 | [0] | LSB |
| 3nd cycle | | | | | | | | | | | | | | | | 1 | [1] | |
| 2nd cycle | | | | | | | | | | | | | | | | 0 | [2] | |
| 1st cycle | | | | | | | | | | | | | | | | 1 | [3] | MSB |
| Code | 0 | 1 | 2 | 3 | 4 | 5 | 6 | 7 | 8 | 9 | 10 | 11 | 12 | 13 | 14 | 15 | | |

PLL CIRCUIT

CROSS REFERENCES TO RELATED APPLICATIONS

This application is a continuation under 35 U.S.C. § 120 of PCT/JP2020/044205, filed Nov. 27, 2020, which is incorporated herein by reference, and which claimed priority to Japanese Application No. 2019-220372, filed Dec. 5, 2019. The present application likewise claims priority under 35 U.S.C. § 119 to Japanese Application No. 2019-220372, filed Dec. 5, 2019, the entire content of which is also incorporated herein by reference.

BACKGROUND

1. Technical Field

The present disclosure relates to a Phase Locked Loop (PLL) circuit.

2. Description of the Related Art

Frequency synthesizers that generate a clock having an arbitrary frequency based on a reference clock are used for various kinds of Integrated Circuits (ICs). As such a frequency synthesizer, PLL circuits are widely employed. FIG. 1A through FIG. 1C are block diagram for explaining a basic architecture of a PLL circuit.

FIG. 1A shows an analog PLL circuit 1. The analog PLL circuit 1 includes a phase comparator (PFD: Phase Frequency Detector) 10, a charge pump circuit 12, a low-pass filter 14, a voltage controlled oscillator (VCO) 16, and a frequency divider 18. The VCO 16 oscillates at a frequency that corresponds to an analog control voltage $V_{CTRL}$. The output clock CLK_VCO of the VCO 16 is divided by N by means of the frequency divider 18. The phase comparator 10 detects the phase difference between the divided clock CLK_DIV and a reference clock CLK_REF, so as to control the charge pump circuit 12. The low-pass filter 14 is a loop filter that smooths the output voltage of the charge pump circuit 12, so as to generate the control voltage $V_{CTRL}$.

The analog PLL circuit 1 shown in FIG. 1A has been employed in various kinds of applications from long ago and is highly reliable. However, it has a problem of a large chip size due to the loop filter. In addition, in order to provide sufficient performance, the circuit designer must optimize the circuit layout.

FIG. 1B shows an all-digital PLL circuit (ADPLL) 2. The ADPLL circuit 2 receives a frequency control word (FCW) and the reference clock CLK_REF and multiplies the reference clock CLK_REF according to the FCW so as to generate an output clock CLK_DCO. The ADPLL circuit 2 includes a frequency/phase comparator 20, a digital filter 22, and a digitally controlled oscillator (DCO) 24. The DCO 24 oscillates at a frequency that corresponds to the input control code $D_{CTRL}$. The frequency phase comparator 20 has functions that correspond to the phase comparator 10, the charge pump circuit 12, and the frequency divider 18 shown in FIG. 1. The frequency phase comparator 20 is configured including a time-digital converter (TDC), an adder, a counter, etc. The digital signal generated by the frequency/phase comparator 20 is filtered by the digital filter 22 and is input to the DCO 24.

The ADPLL circuit 2 shown in FIG. 1B can be configured using a CMOS process. This allows the circuit to be miniaturized in a simple manner, thereby providing an advantage of allowing the chip area to be reduced. However, although the ADPLL circuit 2 is configured as a so-called all-digital circuit, the circuit designer must optimize the circuit layout for the frequency/phase comparator 20 and the DCO 24 to satisfy the required specifications.

FIG. 1C shows an injection-locked PLL circuit 3 (which will also be referred to as an "IL-PLL circuit"). The IL-PLL circuit 3 can be designed to have an analog circuit architecture or a digital circuit architecture. In this example, description will be made regarding an arrangement in which the IL-PLL circuit 3 is configured as a digital circuit. The IL-PLL circuit 3 includes a feedback circuit 30, a DCO 32, and an edge injection circuit 34. The IL-PLL circuit 3 can be regarded as a hybrid of feedback control and feedforward control. The oscillation frequency of the DCO 32 is stabilized by feedback control by means of the feedback circuit 30 that corresponds to the frequency/phase comparator 20 and the digital filter 22 shown in FIG. 1B. The edge injection circuit 34 cuts out an edge of the reference clock CLK_REF, and injects the edge thus cut out to the DCO 32 so as to realign the phase of the output clock CLK_DCO. In some cases, the IL-PLL circuit is also referred to as a multiplying delay-locked loop (MDLL) circuit according to the edge injection method.

The IL-PLL circuit provides (i) loop bandwidth broadened by injection locking, thereby allowing phase noise (jitter) to be reduced. In a case in which the IL-PLL circuit is configured as a digital circuit, (ii) the IL-PLL circuit includes neither the phase comparator 10 nor the charge pump 12, thereby providing an advantage of low noise. In addition, (iii) the feedback path is resistant to the effects of noise. Accordingly, it can be said that the IL-PLL circuit provides an improved degree of layout design freedom, which provides an advantage of allowing desired characteristics to be obtained even using automatic layout and wiring using a design support tool such as a P&R (Place and Route) tool or the like.

The PLL circuits shown in FIG. 1A and FIG. 1B each have a loop filter. Accordingly, such an arrangement has a problem of a long time (which will be referred to as a "startup time") from the start of the startup operation to the phase locking. In order to reduce the startup time, various techniques have been proposed.

Conventional high-speed startup techniques are mainly based on an arrangement in which the loop filter characteristics are dynamically controlled according to the frequency entrainment state (e.g., non-patent documents 2, 5, 8, 9, 10, 11). However, such an arrangement uses feedback control, leading to a non-negligible delay before the frequency entrainment. In addition, such an arrangement has a problem in that the time to the phase locking fluctuates due to the conditions in this stage.

With techniques described in non-patent documents 1, 3, 4, 6, and 7, immediately after the startup operation, a control signal to be applied to a variable frequency oscillator is changed by feedforward control. After judgement of the locked state has been made, the control operation is switched to feedback control. In this method, this allows the frequency entrainment time to be reduced. However, after the completion of the frequency entrainment, because feedback control is employed until the phase locking, there is a delay. With this, the time required for phase locking fluctuates according to the conditions in this stage.

SUMMARY

The present disclosure has been made in order to solve such a problem. Accordingly, it is an exemplary purpose of an embodiment of the present disclosure to provide an injection-locked PLL circuit that enables a high-speed startup operation in a predetermined period of time.

An embodiment of the present disclosure relates to a Phase Locked Loop (PLL) circuit configured as an injection locked circuit. The PLL circuit includes: a digitally controlled oscillator structured such that, during a period in which a selection signal is asserted, a ring oscillator is formed so as to oscillate at a frequency that corresponds to a control code, and such that, during a period in which the selection signal is negated, an injection edge based on a reference clock can be injected; and a controller structured to control the digitally controlled oscillator. The controller is configured such that (A) in a startup period of the PLL circuit, the controller is set to a first mode, and repeats a cycle comprising (i) a process in which the selection signal is asserted so as to oscillate the digitally controlled oscillator, and phase comparison is made between an oscillator clock generated by the digitally controlled oscillator and the reference clock, and (ii) a process in which the selection signal is negated so as to stop the digitally controlled oscillator, and the control code is updated by a binary search based on a result of the phase comparison.

Another embodiment of the present discloser relates to a control method for a PLL circuit. The PLL circuit includes a digitally controlled oscillator structured such that, during a period in which a selection signal is asserted, a ring oscillator is formed so as to oscillate at a frequency that corresponds to a control code, and such that, during a period in which the selection signal is negated, an injection edge based on a reference clock can be injected. The control method includes: a step in which, when the PLL circuit is started up a first time, the PLL circuit repeats a cycle comprising (i) a process in which the digitally controlled oscillator is oscillated, and phase comparison is made between an oscillator clock generated by the digitally controlled oscillator and the reference clock, and (ii) a process in which the digitally controlled oscillator is stopped, and the control code is updated by a binary search based on a result of the phase comparison; and a step in which, after completion of the binary search, the digitally controlled oscillator is continuously operated, and the control code is changed such that the phase of the oscillator clock approaches the phase of the reference clock.

It is to be noted that any arbitrary combination or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 4 is a diagram for explaining the transition of a control code based on a binary search.

DETAILED DESCRIPTION

Outline of Embodiments

Figure 1A:
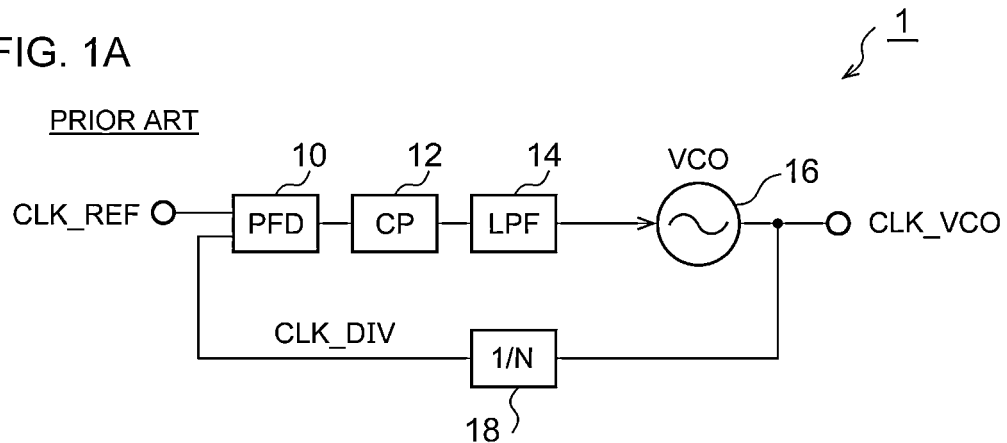
FIG. 1A through FIG. 1C are block diagrams each showing the basic architecture of a PLL circuit.
Figure 1B:
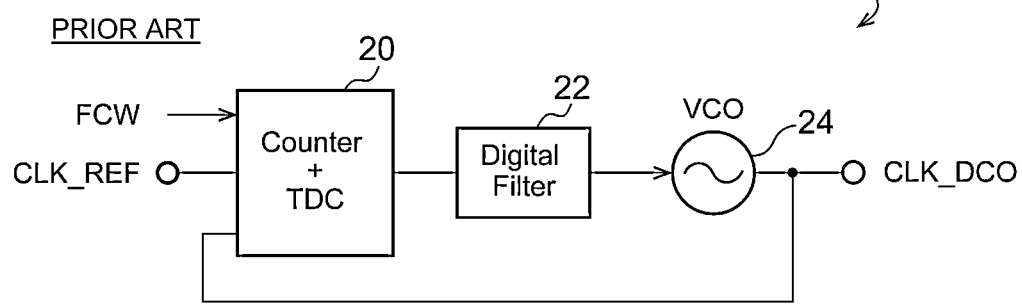
Figure 1C:
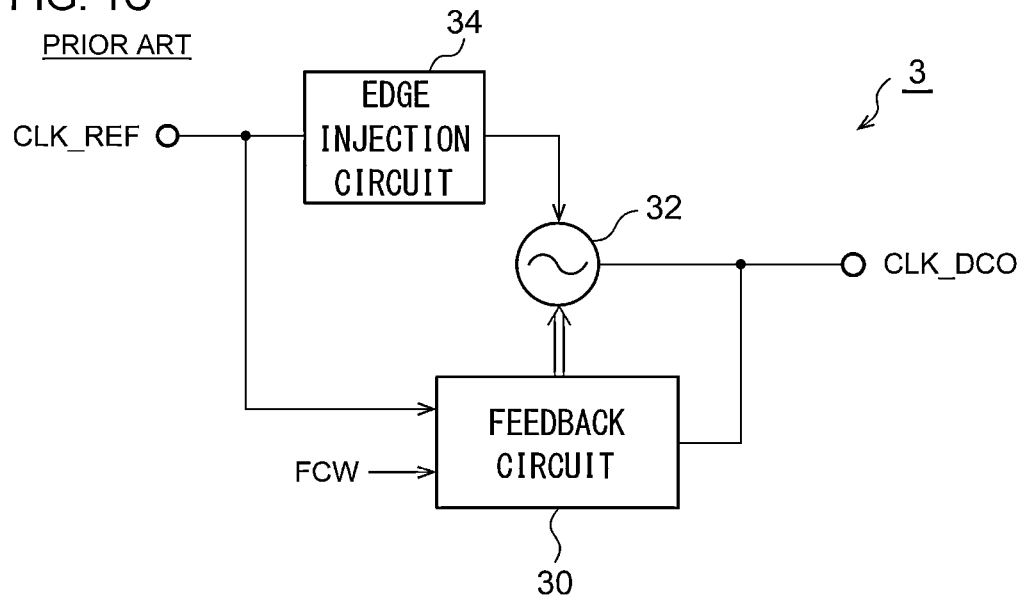

Description will be made regarding an outline of several example embodiments of the present disclosure. In this outline, some concepts of one or more embodiments will be described in a simplified form as a prelude to the more detailed description that is presented later in order to provide a basic understanding of such embodiments. Accordingly, the outline is by no means intended to restrict the scope of the present invention or the present disclosure. Furthermore, this outline is not an extensive overview of all conceivable embodiments and is by no means intended to restrict essential elements of the embodiments. For convenience, the term "one embodiment" may be used herein to refer to a single embodiment (example or modification) or multiple embodiments (examples or modifications) disclosed in the present specification.

An embodiment disclosed in the present specification relates to a Phase Locked Loop (PLL) circuit configured as an injection locked circuit. The PLL circuit includes: a digitally controlled oscillator and a controller structured to control the digitally controlled oscillator. The digitally controlled oscillator is structured such that, during a period in which a selection signal is asserted, a ring oscillator is formed so as to oscillate at a frequency that corresponds to a control code, and such that, during a period in which the selection signal is negated, an injection edge based on a reference clock can be injected. The controller is configured such that (A) in a startup period of the PLL circuit, the controller is set to a first mode, and repeats a cycle comprising (i) a process in which the selection signal is asserted so as to oscillate the digitally controlled oscillator, and phase comparison is made between an oscillator clock generated by the digitally controlled oscillator and the reference clock, and (ii) a process in which the selection signal is negated so as to stop the digitally controlled oscillator, and the control code is updated by a binary search based on a result of the phase comparison.

In a case in which the number of bits of the control code of the digitally controlled oscillator is M, after M cycles after the startup operation is started, the control code becomes an optimum value, thereby completing the frequency entrainment. With such an arrangement configured as an injection-locked PLL circuit, in the subsequent cycles, this is capable of starting oscillation in a phase-locked state with the injection edge. That is to say, this allows the delay time required for the phase locking by feedback to be reduced to zero. In addition, such an arrangement requires a constant startup period of M cycles.

In an embodiment, in the first mode, the controller may switch the selection signal between assertion and negation for every cycle of the reference clock. In this case, one cycle corresponds to two cycles of the reference clock. Accordingly, the startup period is represented by $2 \times M \times T_{REF}$.

In an embodiment, in response to a stop instruction of the PLL circuit, the control code may be held in this stage. In the next startup instruction of the PLL circuit, the controller may immediately start feedback control of the control code with the control code thus held as an initial value. With this, immediately after the first cycle of the reference clock is generated after an enable signal is acquired, this allows the PLL circuit to restart its operation in a phase-locked state. That is to say, with a system provided with the PLL circuit, this allows the PLL circuit to be proactively switched between the operating state and the stopped state. This allows power consumption to be dramatically reduced.

With an embodiment, (B) after completion of the binary search, the controller may be set to a second mode so as to continuously operate the digitally controlled oscillator, the control code may be changed such that the phase of the oscillator clock approaches the phase of the reference clock, and the selection signal may be periodically negated.

In an embodiment, the controller may include a window generator structured to receive an internal clock of the digitally controlled oscillator, and to cut out one pulse so as to generate a window signal. Also, in the normal period, the selection signal may correspond to the window signal. The window opening timing (assertion) and the window closing timing (negation) defined by the window signal are independent of the reference clock. Accordingly, during a period in which the digitally controlled oscillator oscillates, such an arrangement is capable of opening and closing the window in a sure manner regardless of the presence or absence of the reference clock. Furthermore, such an arrangement is capable of providing timing adjustment such that a period in which the window is open includes the injection edge of the reference clock in a sure manner. This prevents the occurrence of glitches or high-frequency oscillation due to the window signal. If a transition (edge) does not occur in the reference clock in a period in which the window is open, the cycle of the internal clock becomes longer once for every predetermined number (the number of the frequency multiplication factor) of cycles. However, oscillation does not stop.

In an embodiment, the window generator may generate a pulse signal such that it is asserted during a period of a half cycle of the internal clock once every N (N≥2) cycles of the internal clock and may delay the pulse signal by a time that is K (0<K<1) times the cycle of the internal clock, so as to generate the window signal. This allows the timing of the window signal to be adjusted such that an injection edge exists in the assertion period of the window signal.

In an embodiment, an arrangement may be made in which K=¼. With this, the timing of the window signal can be adjusted such that an injection edge exists at substantially the center of the assertion period of the window signal. It should be noted that K is not required to be strictly ¼.

In an embodiment, the window generator may include: a counter configured to count an internal clock, and to assert its output during one cycle of the internal clock for every N cycles thereof; a logic gate configured to logically combine the output of the counter and the internal clock so as to generate a pulse signal; and a delay line configured to delay the pulse signal by a delay amount that is ¼ the cycle of the internal clock.

In an embodiment, the digitally controlled oscillator may include a variable delay circuit. The delay line may be configured as a replica having the same circuit configuration of that of the variable delay circuit.

In an embodiment, the delay line may apply a delay that is ½ that provided by the variable delay circuit. In the ring oscillator, the delay amount of the variable delay circuit corresponds to substantially the half cycle of the internal clock. Accordingly, the delay that is ½ the delay provided by the variable delay circuit corresponds to the ¼ cycle of the internal clock.

In an embodiment, the digitally controlled oscillator may include a variable delay circuit and a multiplexer configured such that it receives the internal clock that is an output of the variable delay circuit via one input thereof and an injection edge via the other input thereof, such that its output is coupled to an input of the variable delay circuit, and such that it selects one input according to a window signal.

In an embodiment, the window generator may include a replica of the multiplexer through which the window signal passes. This is capable of reducing the effects of timing deviation due to the multiplexer.

In an embodiment, the multiplexer may include: a first NAND gate configured to receive an internal clock via its first input and receive a window signal via its second input; a second NAND gate configured to receive a reference clock via its first input and receive an inverted window signal via its second input; a third NAND gate configured to receive an output of the first NAND gate via its first input and receive an output of the second NAND gate via its second input; and a fourth NAND gate configured to receive an output of the first NAND gate via its first input and receive an output of the second NAND gate via its second input, and configured such that its output is coupled to an output of the third NAND gate. A typical multiplexer includes a pair of two NAND gates configured as a first stage and a single NAND gate configured as a second stage. The NAND gate involves a delay difference that occurs between the two input signals due to the asymmetrical configuration thereof. Accordingly, with such a typical multiplexer, a delay difference occurs between the two input signals of the multiplexer in the NAND gate configured as an output stage. In order to solve such a problem, the output stage may be configured as a pair of two NAND gates such that each output NAND gate is coupled so as to receive inputs that are swapped from the inputs of the other output NAND gate. This allows the delay difference that occurs between the two input signals to be canceled out.

In an embodiment, the variable delay circuit may include a first delay circuit configured to apply a delay control amount with a coarse resolution and a second delay circuit configured to apply a sufficiently short delay control amount with a delay amount that corresponds to 1 LSB of the control amount of the first delay circuit as its full scale. The delay line may include a replica of the first delay circuit. Also, the delay line may receive the supply of a second control code having a value that is ½ the first control code to be supplied to the first delay circuit. In this case, the delay amount of the variable delay circuit is dominated by the delay provided by the first delay circuit. Accordingly, with such an arrangement employing the replica of such a portion, this is capable of generating a delay that is ¼ the cycle of the internal clock.

In an embodiment, as the injection edge, the reference clock may be directly injected. With this, the reference clock passes through neither a delay circuit nor a logic gate. This allows the occurrence of phase noise in the injection edge due to power supply noise to be reduced.

In an embodiment, the feedback circuit may include: a symmetrical phase detector configured such that, during a period in which the window signal is asserted, the symmetrical phase detector is set to the enable state, and compares the phase of the clock signal generated by the digitally controlled oscillator with that of the reference clock so as to generate an up-down signal that indicates the comparison result; and a digital filter configured to generate a control code that corresponds to the up-down signal. With such an arrangement in which the symmetrical phase detector is enabled during only a period in which the window signal is asserted, such an arrangement is capable of widening the phase entrainment range over one cycle of the reference clock.

In an embodiment, the feedback circuit may include: a phase frequency detector configured such that, during a period in which the window signal is asserted, the phase frequency detector is set to the enable state, and compares the phase and frequency of the clock signal generated by the digitally controlled oscillator with those of the reference clock so as to generate an up pulse and a down pulse that indicate the comparison results; and a digital filter configured to generate a control code that corresponds to an up-down signal based on the up pulse and the down pulse. By employing the phase frequency detector having a frequency entrainment function over a wide phase entrainment range as its original function, and by enabling the phase frequency detector during only a period in which the window signal is asserted, this allows the phase entrainment range to be widened substantially to infinity.

If no injection edge occurs in a period in which the window is open, the frequency of the digitally controlled oscillator fluctuates in the short term for every cycle of the reference clock. In order to solve such a problem, when no edge is detected in the reference clock, the window generator may maintain the window signal in the negated state. With this, even when the reference clock stops, this allows the PLL circuit to continue to generate the clock. In addition, the frequency of the digitally controlled oscillator fluctuates immediately after the reference clock is lost. However, this is capable of subsequently maintaining the clock at a constant value.

In an embodiment, the PLL circuit may further include a clock monitor circuit configured to generate a clock enable signal that is asserted when the reference clock is input normally, and that is negated when the reference clock is stopped. Also, the output of the counter may be masked according to the clock enable signal.

Embodiments

Description will be made below regarding the present invention based on preferred embodiments with reference to the drawings. The same or similar components, members, and processes are denoted by the same reference numerals, and redundant description thereof will be omitted as appropriate. The embodiments have been described for exemplary purposes only and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Figure 2:
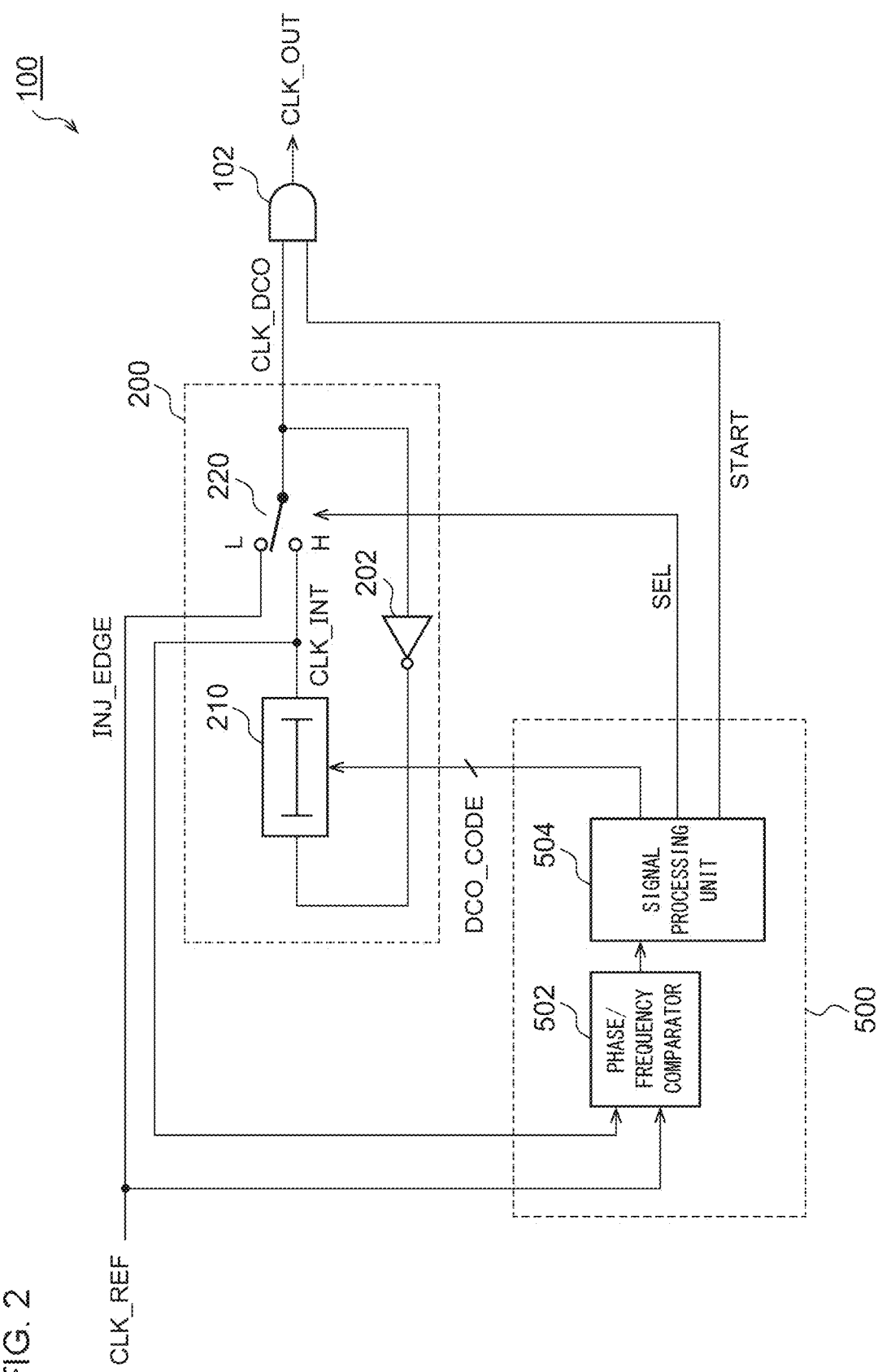
FIG. 2 is a block diagram showing a basic configuration of a PLL circuit according to an embodiment.

FIG. 2 is a block diagram showing a basic configuration of a PLL circuit 100 according to an embodiment. The PLL circuit 100 is configured as an injection-locked PLL circuit including a digitally controlled oscillator (DCO) 200, a controller 500, and an output gate 102.

The DCO 200 is configured such that, during a period in which a selection signal SEL is asserted (e.g., set to high level=1), a ring oscillator is formed so as to oscillate at a frequency that corresponds to an M-bit control code DCO_CODE[M-1:0]. Furthermore, the DCO 200 is configured such that, during a period in which a selection signal SEL is negated (e.g., set to low level=0), an injection edge can be injected based on a reference clock CLK_REF.

The DCO 200 mainly includes an inverter 202, a variable delay circuit 210, and a multiplexer (selector) 220. The multiplexer 220 receives an output signal (internal clock) CLK_INT of the variable delay circuit 210 and an injection edge INJ_EDGE based on the reference clock CLKREF, and selects one from among the signals thus received according to the selection signal SEL. The output CLK_DCO of the multiplexer 220 is inverted by the inverter 202 and is fed back to the input of the variable delay circuit 210. It should be noted that the insertion position of the inverter 202 is not restricted in particular. The insertion position may be provided on the input side or the output side of the variable delay circuit. Also, the insertion position may be embedded in the variable delay circuit or the multiplexer.

With this configuration, the reference clock CLK_REF is directly injected as the injection edge INJ_EDGE. With this, the reference clock CLK_REF passes through neither a delay circuit nor a logic gate. This is capable of reducing phase noise in the injection edge due to power supply noise via such a path.

The controller 500 controls the DCO 200. Specifically, the controller 500 generates the control code DCO_CODE for the variable delay circuit 210, the selection signal SEL for the multiplexer 220, and a start signal START for the output gate 102.

The controller 500 is switchable between a first mode $\phi_1$ and a second mode $\phi_2$. In the startup period of the PLL circuit 100 when the IC power supply is turned on, the controller 500 is set to the first mode $\phi_1$. After the completion of the startup operation, the controller 500 is set to the second mode $\phi_2$. In this specification, the first mode $\phi_1$ will also be referred to as a "binary search mode".

In the first mode $\phi_1$, the controller 500 repeatedly executes a cycle including the following two processes (i) and (ii).

First process: The selection signal SEL is asserted so as to oscillate the DCO 200. Phase comparison is made between the reference clock CLK_REF and the internal clock CLK_INT (or the output clock CLK_DCO) that is an oscillator clock generated by the DCO 200.

Second process: The selection signal SEL is negated so as to stop the operation of the DCO 200, and the control code DCO_CODE is updated by a binary search based on the phase comparison results obtained in Step (i).

For example, in the first mode $\phi_1$, the controller 500 may switch the selection signal SEL between assertion and negation for every cycle of the reference clock CLK_REF. That is to say, in the first mode $\phi_1$, the DCO 200 alternately repeats an oscillation state and a suspension state for every cycle of the reference clock CLK_REF, thereby repeatedly updating the oscillation frequency thereof.

In the second mode $\phi_2$, the controller 500 continuously operates the DCO 200, and changes the control code DCO_CODE such that the phase and the frequency of the oscillator clock CLK_INT approach the phase and the frequency of the reference clock CLK_REF. Furthermore, the controller 500 periodically negates the selection signal SEL, and injects an injection edge based on the reference clock CLK_REF into the DCO 200 so as to apply phase locking.

In the first mode $\phi_1$, the controller 500 negates (sets to the low level) the start signal START. In the second mode $\phi_2$, the controller 500 asserts (sets to the high level) the start signal START. The output gate 102 receives the clock CLK_DCO generated by the DCO 200 and the START signal. During a period in which the START signal is negated, i.e., during a period in which the PLL circuit 100 is started up, the output gate 102 blocks the clock CLK_DCO. Conversely, during a period in which the START signal is asserted, i.e., after the completion of the startup operation of the PLL circuit 100, the output gate 102 passes through the clock CLK_DCO, thereby outputting the output clock CLK_OUT.

Relating to the first mode, the controller 500 includes a phase/frequency comparator (phase/frequency detector) 502 and a signal processing unit 504. The phase/frequency comparator 502 compares the frequencies and the phases of the reference clock CLK_REF and the internal clock CLK_INT of the DCO 200. It should be noted that the phase/frequency comparator 502 may be configured as a combination of a phase comparator (phase detector) and a frequency comparator (frequency detector). In the first mode $\phi_1$, the signal processing unit 504 changes the control code DCO_CODE by a binary search based on the output of the phase/frequency comparator 502. Furthermore, in the second mode $\phi_2$, the signal processing unit 504 integrates (smooths) the output of the phase/frequency comparator 502 so as to generate the control code DCO_CODE. The configuration of the signal processing unit 504 relating to the second mode $\phi_2$ may be provided employing known techniques. Typically, the signal processing unit 504 may include a digital filter. Also, the signal processing unit 504 may include a state machine for controlling the first mode $\phi_1$ and the second mode $\phi_2$.

Figure 3:
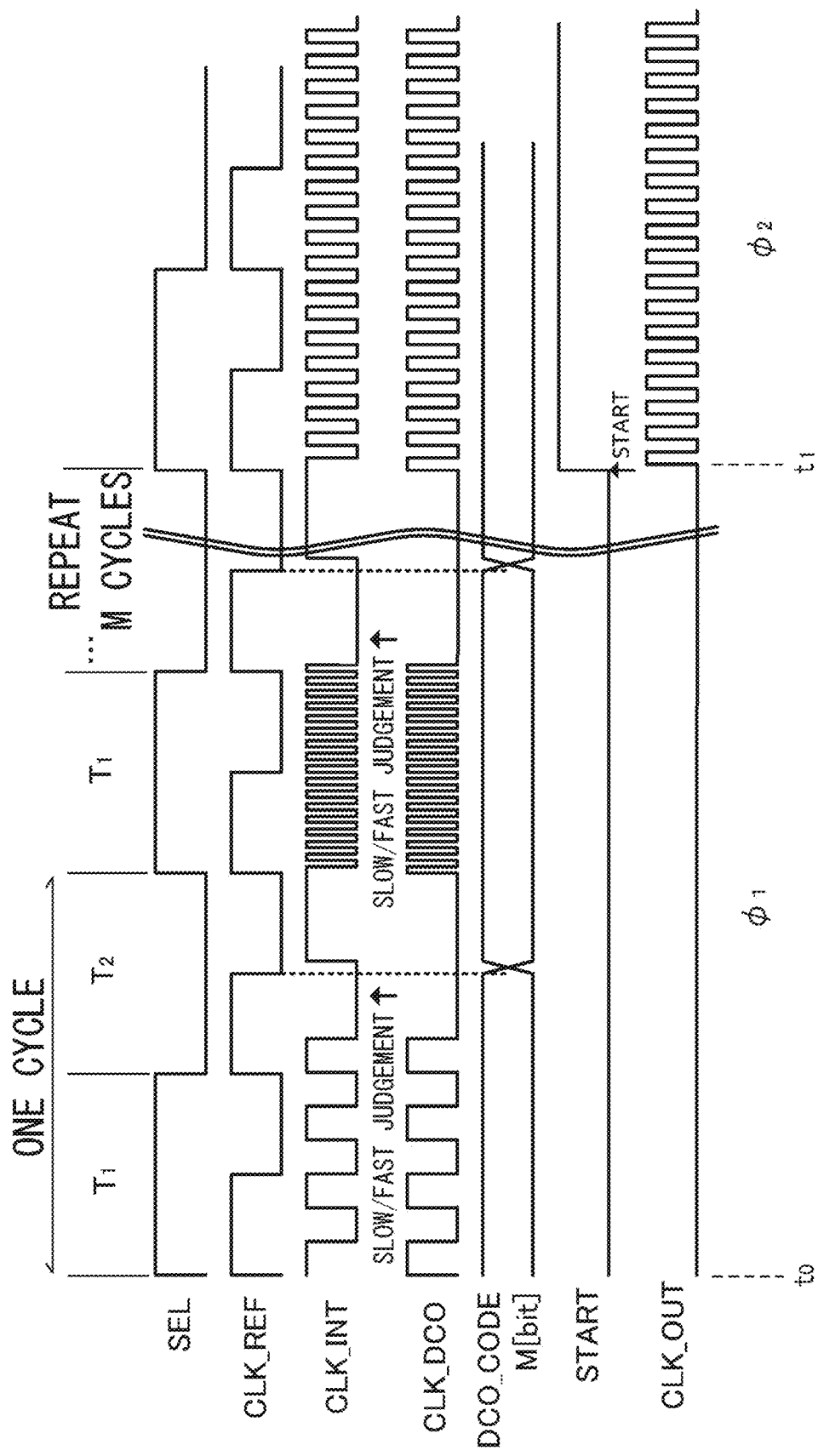
FIG. 3 is an operation waveform diagram of the PLL circuit shown in FIG. 2.

The above is the configuration of the PLL circuit 100. Next, description will be made regarding the operation thereof. FIG. 3 is an operation waveform diagram of the PLL circuit 100 shown in FIG. 2. At the time point $t_0$, the PLL circuit 100 is started up, and is set to first mode $\phi_1$.

During the first mode $\phi_1$, a cycle comprising a first period $T_1$ in which the first process is executed and a second period $T_2$ in which the second process is executed is repeatedly executed. In this mode, the control code DCO_CODE[M-1:0] for the DCO 200 is updated based on the binary search. Subsequently, after the M cycles are repeatedly executed, i.e., at the time point $t_1$ after (2×M) cycles of the reference clock CLK_REF elapse, the mode transits to the second mode $\phi_2$ with the optimum control code DCO_CODE obtained in the search. In the second mode $\phi_2$, the START signal is asserted, thereby supplying the output clock CLK_OUT to a block outside the PLL circuit 100. The control code DCO_CODE is optimized by the phase locked loop, thereby stabilizing the frequency of the output clock CLK_OUT to N times the reference clock CLK_REF.

FIG. 4 is a diagram for explaining the transition of the control code based on the binary search. Description will be made below regarding an arrangement in which the number of bits M of the control code DCO_CODE is 4, and the target code is [0067] (which is 11 in decimal notation).

The above is the operation of the PLL circuit 100. With the PLL circuit 100, in a case in which the number of bits of the control code DCO_CODE is M, after the M cycles elapse after the startup operation, the control code DCO_CODE becomes an optimum value, thereby completing the frequency entrainment. With such an arrangement configured as an injection-locked PLL circuit, in the subsequent cycles, this is capable of starting oscillation in a phase-locked state with the injection edge. That is to say, this allows the delay time required for the phase locking by feedback to be reduced to zero, thereby enabling a high-speed startup operation. In addition, such an arrangement requires a constant startup period of the M cycles.

Figure 5:
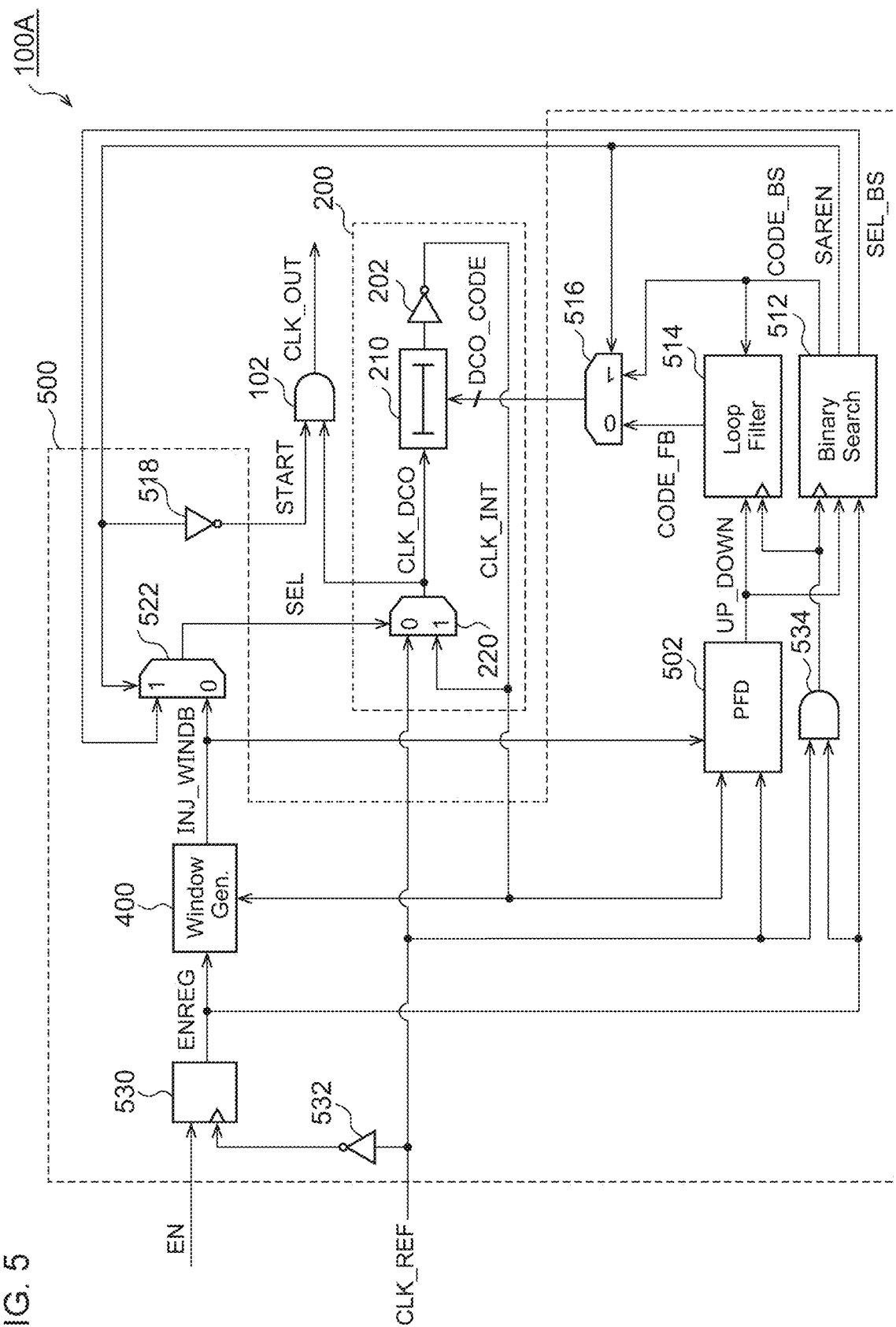
FIG. 5 is a diagram showing an example configuration of the PLL circuit.

FIG. 5 is a diagram showing an example configuration (100A) of the PLL circuit 100. A part of the controller 500 other than the phase/frequency comparator 502 corresponds to the signal processing unit 504 shown in FIG. 2. The controller 500 receives an enable signal EN that is an instruction to start up or to stop the PLL circuit 100. When the enable signal EN is asserted (set to the high level), the mode is set to the first mode $\phi_1$ according to the assertion of the enable signal EN as a trigger. In the first mode $\phi_1$, the startup operation is started.

The flip-flop 530 and the inverter 532 retime the enable signal EN with an edge (negative edge in this example) of the reference clock CLK_REF, thereby generating the ENREG signal.

During a period in which the ENERG signal is set to the high level, an AND gate 534 supplies the reference clock CLK_REF as an operation clock to a binary search unit 512 and a loop filter 514.

When the ENREG signal is asserted (set to the high level), a window generator 400 is activated. The window generator 400 receives the internal clock CLK_INT of the DCO 200, cuts out one pulse every N pulses thereof, and delays the pulse signal thus cut out by ¼ cycle of the internal clock CLK_INT, so as to generate a window signal INJ_WINDB. Here, N represents the multiplication ratio of the PLL circuit 100. In the second mode $\phi_2$, the window signal INJ_WINDB is selected by a selector 522, and is supplied to the multiplexer 220 as the selection signal SEL.

Furthermore, the window signal INJ_WINDB is supplied to the phase/frequency comparator 502. At a timing (in a period) specified by the window signal INJ_WINDB, the phase/frequency comparator 502 compares the phases of the two clock signals CLK_REF and CLK_INT, and outputs a signal UP_DOWN that indicates the comparison result.

In the first mode $\phi_1$ immediately after the PLL circuit 100 is started up, the binary search unit 512 is activated. In this mode, the binary search unit 512 changes the control code DCO_CODE based on the output UP_DOWN of the phase/frequency comparator 502. During the first mode $\phi_1$, the binary search unit 512 asserts (set to the high level) a search enable signal SAREN. After the binary search is complete, the binary search unit 512 negates (set to the low level) the SAREN signal, thereby switching the mode to the second mode $\phi_2$.

During the first mode $\phi_1$, a code CODE_BS generated by the binary search unit 512 is supplied as the control code DCO_CODE to the variable delay circuit 210 via a selector 516. Furthermore, after the first mode $\phi_1$ ends, the code CODE_BS is set to an initial value of the loop filter 514.

Furthermore, the binary search unit 512 generates a selection signal SEL_BS with a level that is inverted for every cycle of the reference clock CLK_REF. During the first mode $\phi_1$, the SEL_BS signal is selected by the selector 522 and is supplied as the selection signal SEL to the multiplexer 220.

In the second mode $\phi_2$, the loop filter 514 is activated. In this state, the loop filter 514 generates a control code CODE_FB based on the output UP_DOWN of the phase/frequency comparator 502. During the second mode $\phi_2$, the code CODE_FB generated by the loop filter 514 is supplied as the control code DCO_CODE to the variable delay circuit 210 via the selector 516.

The SAREN signal is inverted by an inverter 518 and is supplied as the START signal to the output gate 102.

Figure 6:
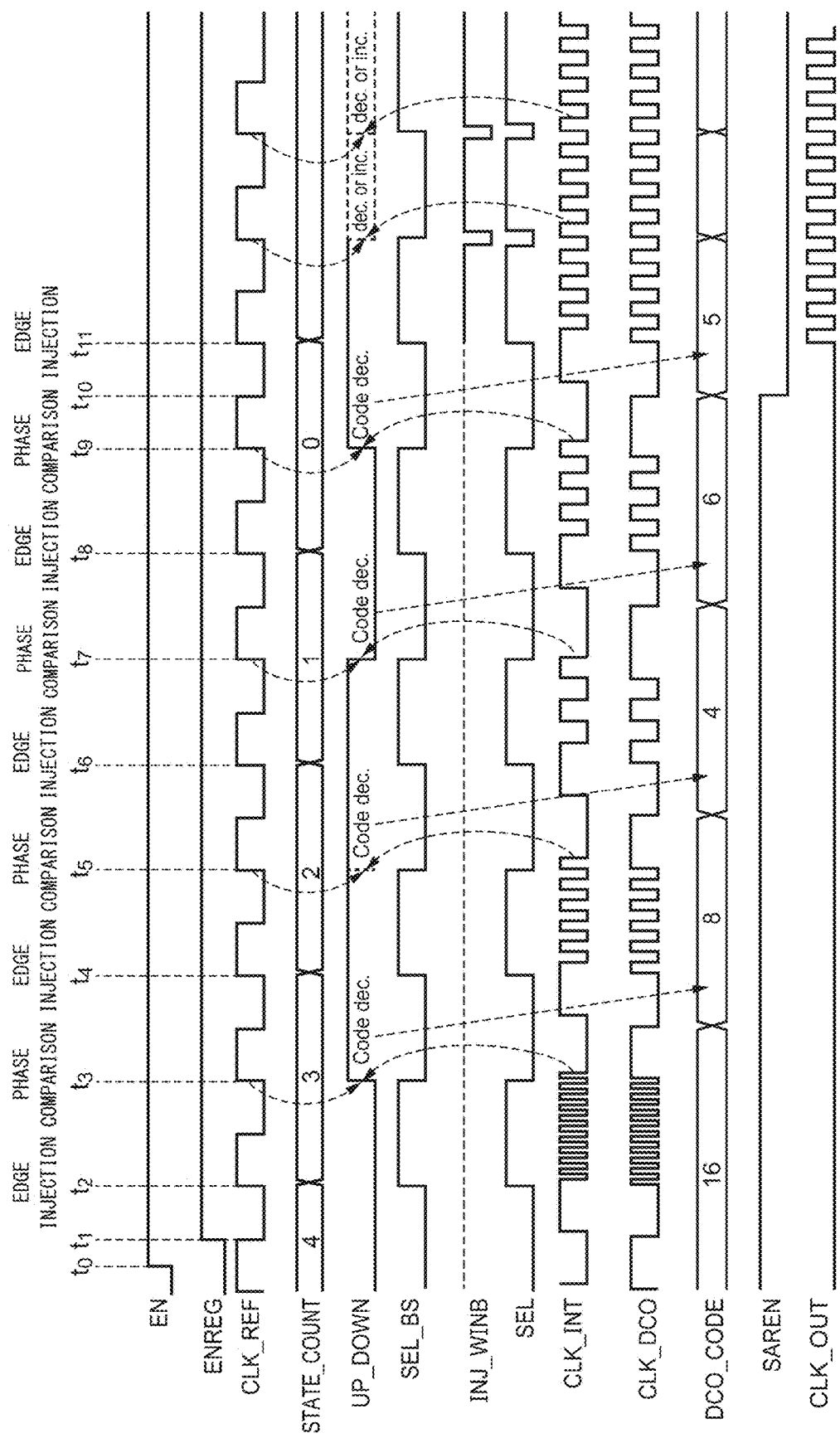
FIG. 6 is an operation waveform diagram of the PLL circuit shown in FIG. 5.
Figure 7:
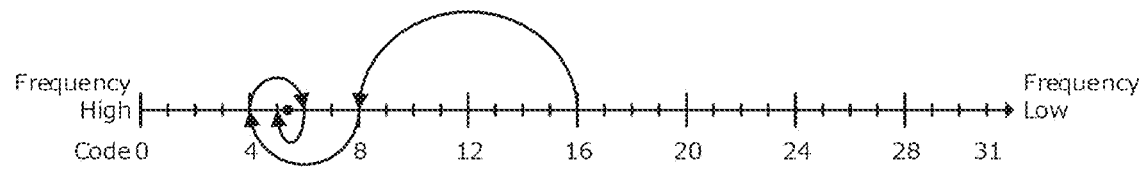
FIG. 7 is a diagram showing frequency transition based on a binary search.

The above is the configuration of the PLL circuit 100A. Next, description will be made regarding the operation thereof. FIG. 6 is an operation waveform diagram of the PLL circuit 100A shown in FIG. 5. Description will be made below regarding an example in which the number of bits M of the control code DCO_CODE is 4. FIG. 7 is a diagram showing the transition of the frequency based on the binary search.

Referring to FIG. 6, at the time point $t_0$, the enable signal EN is set to the high level. At the time point $t_1$, the enable signal EN is acquired in response to the negative edge of the reference clock CLK_REF, which sets the ENREG signal to the high level, thereby switching the mode to the first mode $\phi_1$. The SEL_BS signal is inverted for every cycle of the reference clock CLK_REF, which is used as the SEL signal.

At the time points $t_2$, $t_4$, $t_6$, and $t_8$ every time the SEL signal becomes the high level, the positive edge of the reference clock CLK_REF is injected into the DCO 200, thereby oscillating the DCO 200. Furthermore, at the time points $t_3$, $t_5$, $t_7$, and $t_9$ every time the SEL signal becomes the low level, phase comparison is executed. As a result of the phase comparison, when judgement has been made that the UP_DOWN signal is the high level, the control code DCO_CODE (CODE_BS) is increased, and when judgement has been made that the UP_DOWN signal is the low level, the control code DCO_CODE (CODE_BS) is decreased. The value of the control code DCO_CODE is fixed in descending order from the most significant bit MSB to the least significant bit LSB for every phase comparison. STATE_COUNT is a count value for specifying the target bit in the binary search.

At the time point $t_{10}$, when the binary search is complete for all the bits, the SAREN signal is set to the low level, thereby switching the mode to the second mode $\phi_2$. The control code CODE_BS acquired by the binary search is set to the initial value of the loop filter 514. Subsequently, when an edge of the reference clock CLK_REF is injected at the time point $t_{11}$, the DCO 200 starts to oscillate. Furthermore, the control code CODE_FB is adjusted by the loop filter 514. In this stage, the loop filter 514 becomes a state that is equivalent to a frequency-locked state provided by the binary search. Accordingly, the PLL circuit 100A has an advantage that, immediately after the reference clock CLK_REF is input at the time point $t_{11}$, the PLL circuit 100A is able to start its operation from a state that is equivalent to the phase-locked state provided by the binary search. Furthermore, the window signal INJ_WINDB having the positive edges of the reference clock CLK_REF is generated. Accordingly, the reference clock CLK_REF is injected into the DCO 200, thereby maintaining the phase-locked state.

The above is the normal startup operation of the PLL circuit 100A. Next, description will be made regarding a high-speed startup operation of the PLL circuit 100 (100A).

In the initial startup operation, in the first mode $\phi_1$, the controller 500 searches for the optimum control code DCO_CODE by the binary search. In the second and subsequent startup operations, the controller 500 immediately starts the oscillation without executing the first mode $\phi_1$. Specifically, in response to a stop instruction (low level of the enable signal EN) for stopping the PLL circuit 100, the controller 500 holds the control code DCO_CODE in this stage. Upon receiving the next startup instruction (high level of the enable signal EN) for starting up the PLL circuit 100, the controller 500 immediately switches the mode to the second mode using the control code thus held as the initial value.

Figure 8:
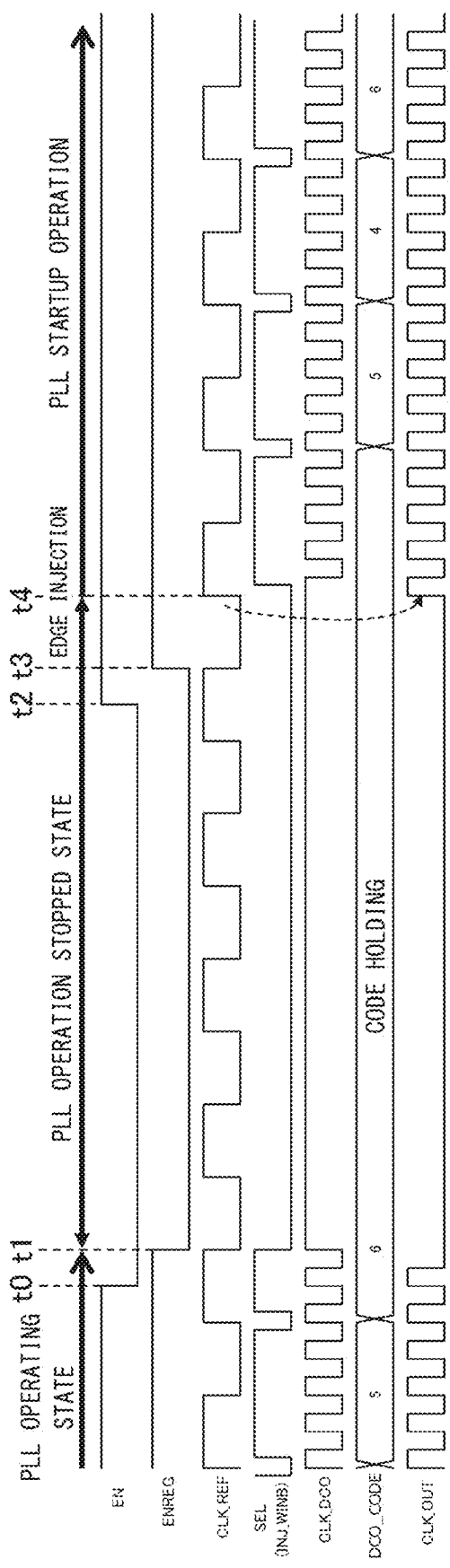
FIG. 8 is a time chart for explaining the second and subsequent startup operations of the PLL circuit.

FIG. 8 is a time chart for explaining the second and subsequent startup operations of the PLL circuit 100. When the ENREG signal becomes the low level at the time point $t_1$ after the enable signal EN becomes the low level at the time point $t_0$, the PLL circuit 100 is stopped. Even after the PLL circuit 100 stops, the value of the control code DCO_CODE is held. At the time point $t_2$, the enable signal EN becomes the high level. Subsequently, at the time point $t_3$, the ENREG signal becomes the high level. When an edge of the reference cock CLK_REF is injected at the time point $t_4$, the PLL circuit 100 starts to oscillate. As described above, in the second and subsequent startup operations, such an arrangement requires one cycle to restart its operation in a phase-locked state.

That is to say, with such a system provided with the injection-locked PLL circuit 100, this allows the PLL circuit to be proactively switched between the operating state and the stopped state. With this, by setting the enable signal EN to the low level during a period in which the operation of the load to which the clock CLK_OUT is to be supplied is stopped, such an arrangement allows power consumption of the PLL circuit 100 to be dramatically reduced.

Figure 9:
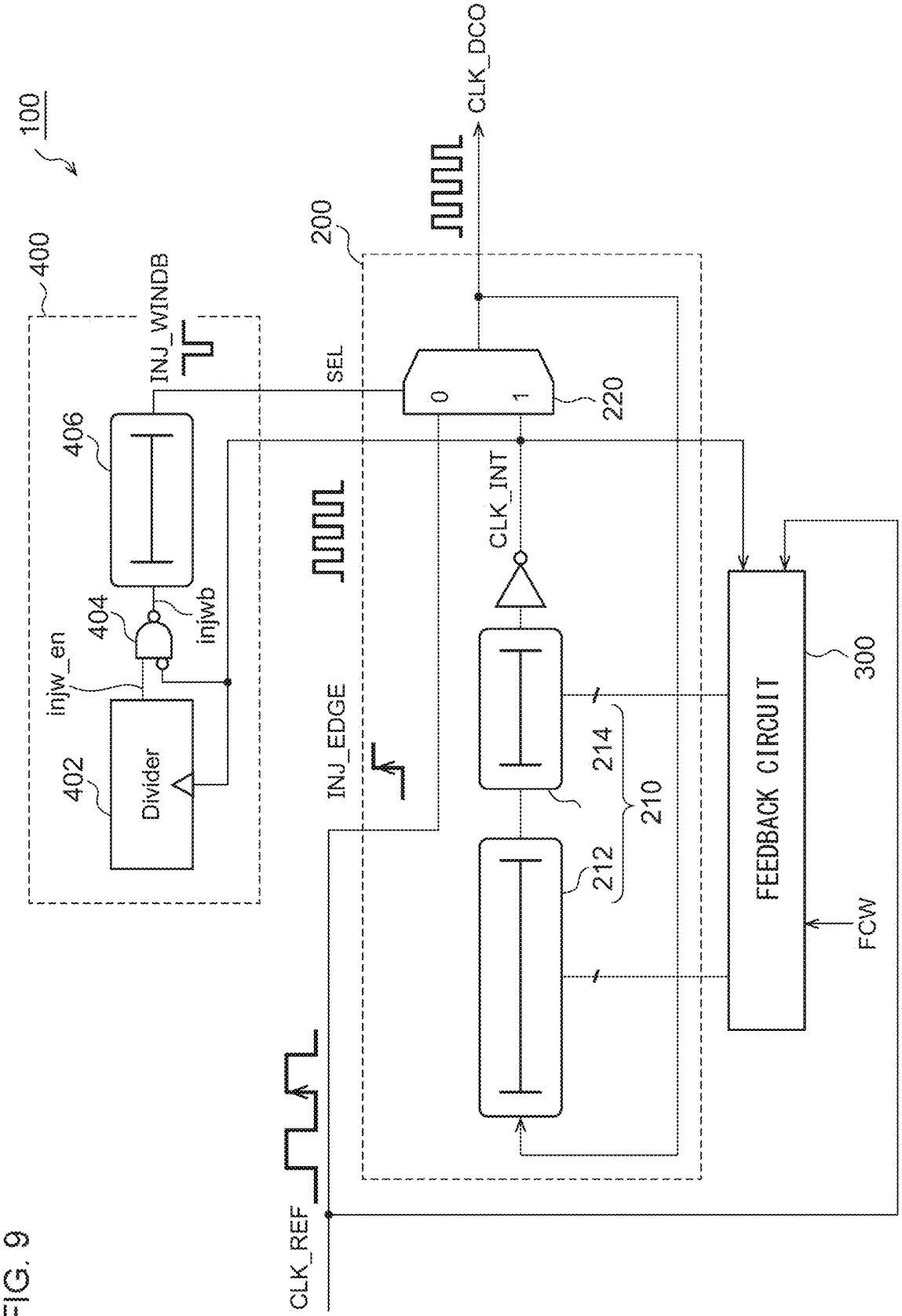
FIG. 9 is a circuit diagram showing an example configuration of a window generator shown in FIG. 5.

FIG. 9 is a circuit diagram showing an example configuration of the window generator 400 shown in FIG. 5. In FIG. 9, the selector 522, the binary search unit 512, etc., are not shown.

The variable delay circuit 210 may be configured as a series connection of a first delay circuit 212 and a second delay circuit 214. The first delay circuit 212 applies a delay with a relatively coarse resolution. The second delay circuit 214 applies a delay with a fine resolution. The output of the variable delay circuit 210 is drawn as the internal clock CLK_INT to circuit outside the variable frequency oscillator 200. The variable frequency oscillator 200, which is configured as a ring oscillator, includes an inverter for logical inversion. However, the position at which the inverter is to be inserted is not restricted in particular. The inverter may be provided on the input side or the output side of the variable delay circuit. Also, the inverter may be built into the variable delay circuit or the multiplexer.

The multiplexer 220 receives the internal clock CLK_INT via one input (1) thereof and receives the injection edge INJ_EDGE via the other input (0) thereof. The multiplexer 220 selects one signal that corresponds to the selection signal SEL (window signal INJ_WINDB). Specifically, when the window signal INJ_WINDB is asserted (low level=0 in a negative logic system employed in the present embodiment), the multiplexer 220 selects the injection edge INJ_EDGE. When the window signal INJ_WINDOWB is negated (high level=1), the multiplexer 220 selects the internal clock CLK_INT. The output of the multiplexer 220 is returned to the input of the variable delay circuit 210.

The feedback circuit 300 corresponds to the phase/frequency comparator 502 and the loop filter 514 shown in FIG. 5. The feedback circuit 300 feedback controls the control code to be supplied to the variable delay circuit 210 such that the oscillation frequency $f_{DCO}$ of the variable frequency oscillator 200 approaches the target frequency based on the frequency $f_{REF}$ of the reference clock CLK_REF. For example, the feedback circuit 300 receives a Frequency Control Word (FCW) that defines the target frequency $f_{TGT}$ as its input. The feedback circuit 300 stabilizes the frequency $f_{DCO}$ of the internal clock CLK_INT (i.e., output clock CLK_DCO) to the target frequency represented by $f_{REF}\times$FCW.

The configuration and the control method of the feedback circuit 300 are not restricted in particular. Either the Frequency Locked Loop (FLL) method or the Phase Locked Loop (PLL) method may be employed. Alternatively, a combination of both may be employed. For example, the delay amount of the first delay circuit 212 may be controlled using the FLL method. Also, the delay amount of the second delay circuit 214 may be controlled using the PLL method. Alternatively, both the delay amounts provided by the first delay circuit 212 and the second delay circuit 214 may be controlled using the PLL method.

The window generator 400 receives the internal clock CLK_INT, and cuts out one pulse, so as to generate the window signal INJ_WINDB. That is to say, in the present embodiment, the window signal INJ_WINDB is generated independently of the reference clock CLK_REF.

Figure 10:
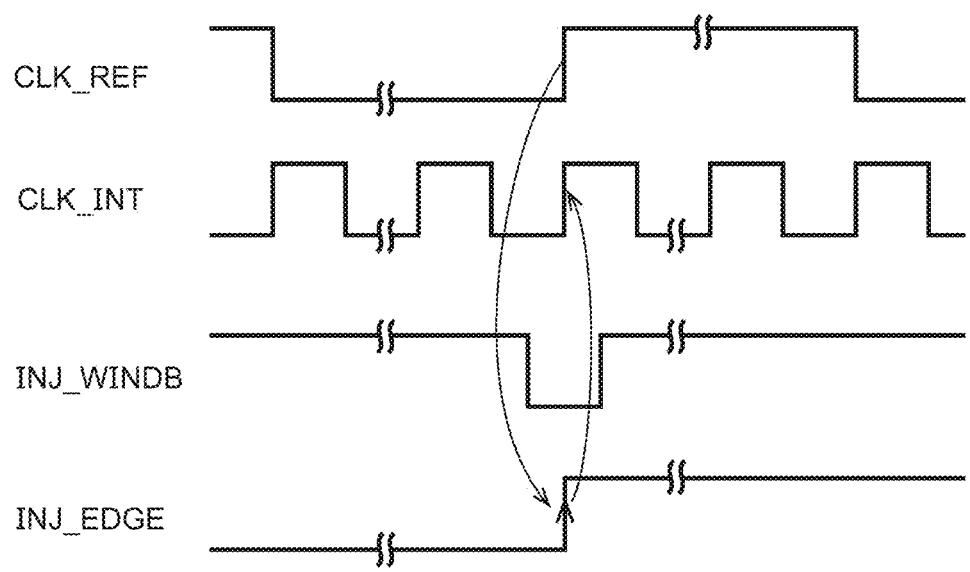
FIG. 10 is an operation waveform diagram of the PLL circuit shown in FIG. 9.

The above is the basic configuration of the PLL circuit 100. Next, description will be made regarding the operation thereof. FIG. 10 is an operation waveform diagram of the PLL circuit 100 shown in FIG. 9. The internal clock CLK_INT generated by the variable frequency oscillator 200 and the output clock CLK_DCO are each configured as a signal having a frequency obtained by multiplying the reference clock CLK_REF by N. The window signal INJ_WINDB is generated by cutting out a pulse (half cycle) of the internal clock CLK_INT and by appropriately adjusting its timing. Accordingly, this allows the window signal INJ_WINDB to include an edge of the reference clock CLK_REF in its assertion period (low period). The injection edge INJ_EDGE is injected into the variable frequency oscillator 200. With this, the internal clock CLK_INT (and output clock CLK_DCO) generated by the variable frequency oscillator 200 is retimed by the injection edge INJ_EDGE.

The above is the operation of the PLL circuit 100. With the PLL circuit 100, the window opening (assertion) timing and the window closing (negation) timing determined by the window signal INJ_WINDB are independent of the reference clock CLK_REF. Accordingly, during a period in which the oscillator 200 oscillates, such an arrangement is capable of opening and closing the window in a sure manner regardless of the presence or absence of the reference clock CLK_REF.

Furthermore, such an arrangement is capable of providing timing adjustment such that a period in which the window is open includes the injection edge INJ_EDGE of the reference clock CLK_REF in a sure manner. This prevents the occurrence of glitches or high-frequency oscillation due to the window signal. If a transition (edge) does not occur in the reference clock in a period in which the window is open, the cycle of the internal clock CLK_INT (and the output clock CLK_DCO) becomes longer once for every predetermined number of cycles (N cycles, N represents the frequency multiplication factor). However, oscillation does not stop. With the PLL circuit 100 shown in FIG. 9, this is capable of solving some of the problems that occur in conventional arrangements.

Returning to FIG. 9, the window generator 400 generates a pulse signal injwb that is asserted during a half cycle of the internal clock CLK_INT (i.e., during a high period or a low period of the internal clock CLK_INT) once for every N (N≥2) cycles of the internal clock CLK_INT. Furthermore, the window generator 400 delays the pulse signal injwb by a time obtained by multiplying the cycle of the internal clock CLK_INT by K (0<K<1) so as to generate the window signal INJ_WINDB. Here, N may preferably be set to the frequency multiplication factor of the PLL circuit 100.

In a case in which K=¼, such an arrangement is capable of adjusting the timing of the window signal INJ_WINDB such that the injection edge INJ_EDGE is at the center of the assertion period (low level) of the window signal INJ_WINDB.

The window generator 400 includes a counter 402, a logic gate 404, and a delay line 406. The counter 402 counts the internal clock CLK_INT and asserts its output injw_en for one cycle for every N cycles. The logic gate 404 performs logical calculation on the output injw_en of the counter 402 and the internal clock CLK_INT so as to generate the pulse signal injwb. For example, the logic gate 404 may include a NAND gate that generates the NAND of the inverted signal of the internal clock CLK_INT and the output injw_en of the counter 402.

Figure 11:
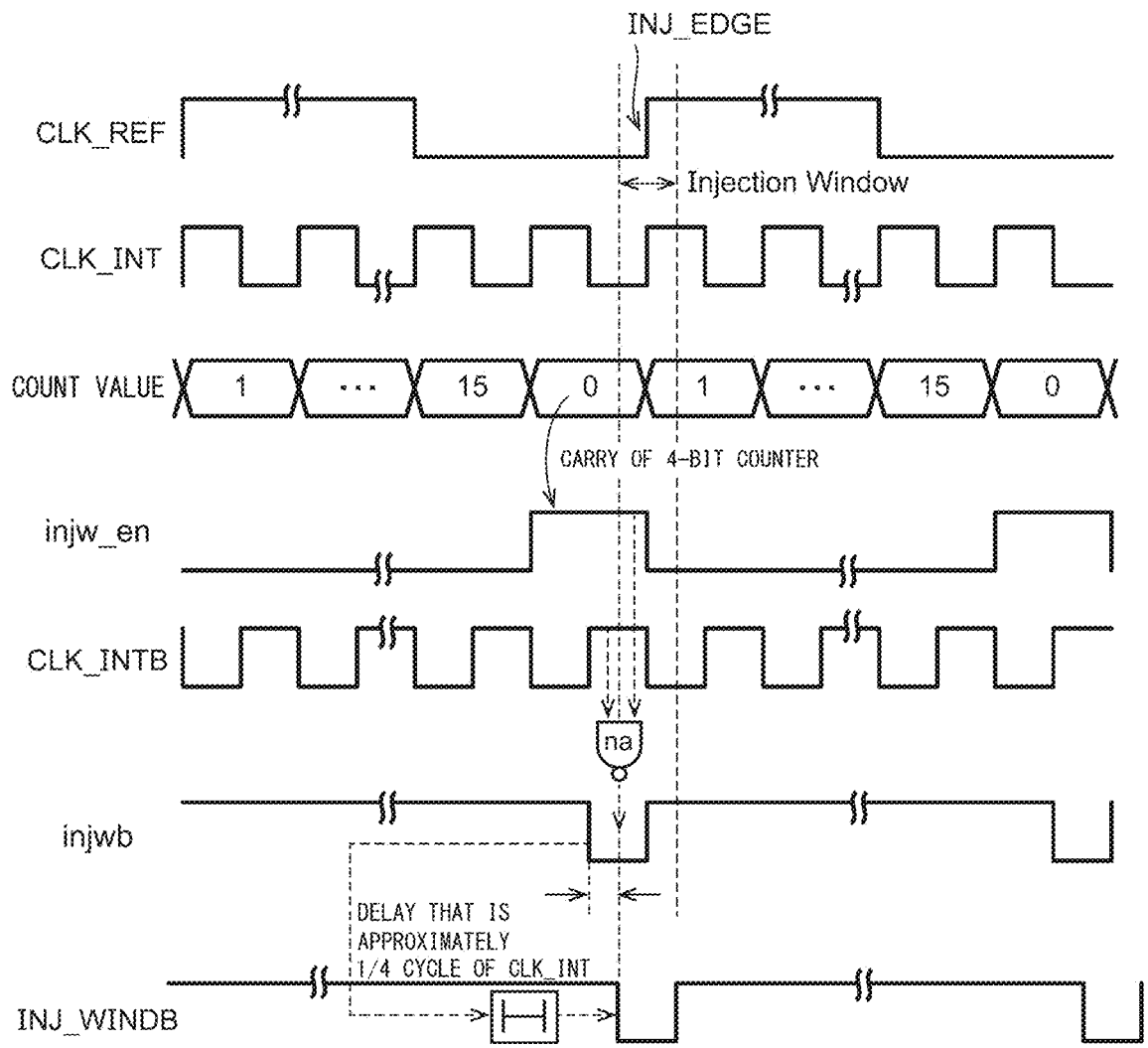
FIG. 11 is an operation waveform diagram of the PLL circuit shown in FIG. 9.

The above is the basic configuration of the PLL circuit 100. Next, description will be made regarding the operation thereof. FIG. 11 is an operation waveform diagram of the PLL circuit 100 shown in FIG. 9. Description will be made below regarding an arrangement in which N=16. The counter 402 is configured as a 4-bit counter. As the carrier signal, the injw_en signal is used. The CLK_INTAB is an inverted signal of the internal clock CLK_INT. The pulse signal injwb is generated by NAND calculation of the injw_en signal and the DOC_INTB signal. The pulse signal injwb thus generated is subjected to a delay that corresponds to approximately ¼ the cycle of the internal clock CLK_INT (½ the pulse width of the CLK_INT), so as to generate the window signal INJ_WINDB. With this, a positive edge (injection edge) of the reference clock CLK_REF is positioned at substantially the center of the INJ_WINDB signal. Accordingly, even if jitter is superimposed on the reference clock CLK_REF, such an arrangement is capable of applying retiming using an injection edge when the jitter is within a range of the pulse width of the internal clock CLK_INT (¼ cycle of the CLK_INT).

Figure 12:
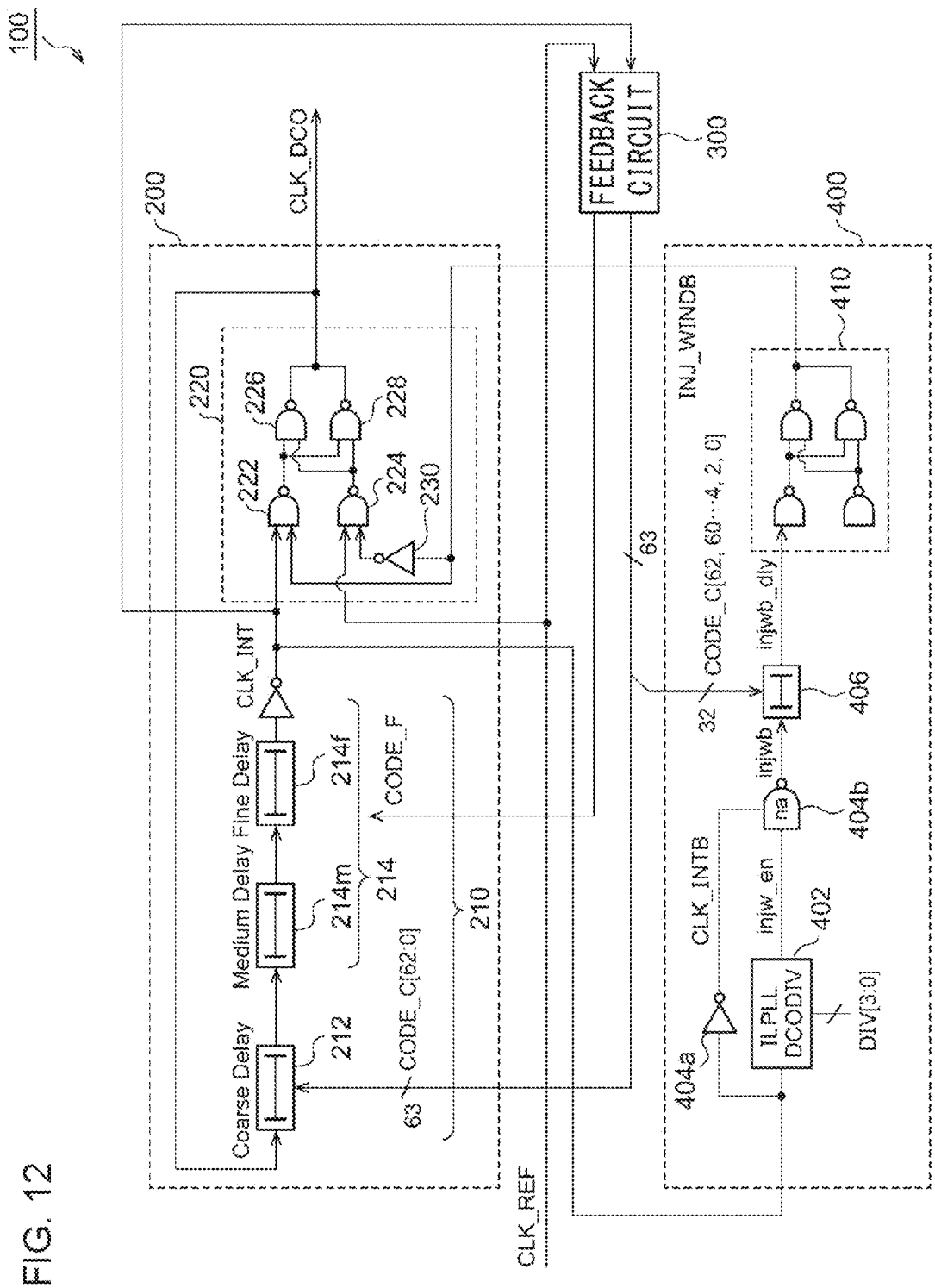
FIG. 12 is a circuit diagram showing a specific example configuration of the PLL circuit.

FIG. 12 is a circuit diagram showing a specific example configuration of the PLL circuit 100. Description will be made regarding the variable frequency oscillator 200. As described above, the first delay circuit 212 and the second delay circuit 214 provide different resolutions. The former delay circuit has a configuration suitable for applying a delay with a low resolution. The latter delay circuit has a configuration suitable for applying a delay with a high resolution. The second delay circuit 214 may include two delay circuits 214*m* and 214*f* having different resolutions.

The multiplexer 220 includes a first NAND gate 222 through a fourth NAND gate 228, and an inverter 230. Typically, the multiplexer 220 is configured as a pair of two NAND gates. However, in some cases, such an arrangement involves a difference in the delay time between two input signals due to element variation. In order to solve such a problem, two pairs of two NAND gates are symmetrically arranged. This allows the difference in the delay time between the two input signals to be reduced.

Next, description will be made regarding the window generator 400. As described above, the delay applied by the delay line 406 is approximately ¼ the cycle of the internal clock CLK_INT. In the variable frequency oscillator 200, the delay applied by the variable delay circuit 210 corresponds to ½ the cycle of the internal clock CLK_INT (CLK_DCO). Accordingly, the half of the delay provided by the variable delay circuit 210 is a delay to be applied to the injwb signal.

The length of the half cycle of the internal clock CLK_INT is dominated by the first delay circuit 212. Accordingly, the delay line 406 is configured to apply ½ the delay of the first delay circuit 212 to the injwb signal assuming that the delay provided by the second delay circuit 214 can be ignored.

The control code to be supplied to the first delay circuit 212 is configured as a thermometer code CODE_C[62:0]. The first delay circuit 212 is configured to be capable of generating a delay obtained by multiplying the value of the thermometer code CODE_C[62:0] (number of bits at which "1" is marked) by a unit delay. In this example, the thermometer code is configured as a 63-bit thermometer code.

The delay line 406 is configured as a replica having the same configuration as that of the delay circuit 212. The delay line 406 is designed to have the same unit delay as that of the first delay circuit 212. However, the number of delay stages of the delay line 406 is ½ that of the first delay circuit 212. Accordingly, the number of bits of the thermometer code CODE_D[31:0] to be supplied to the delay line 406 is ½ that to be supplied to the first delay circuit 212. The CODE_D[31:0] may be generated by thinning out every other bit of the CODE_C[62:0].

FIG. 12 shows the logic gate 404 shown in FIG. 8 as a combination of separate components, i.e., an inverter 404a and a NAND gate 404b. The window generator 400 is provided with a dummy multiplexer 410.

The multiplexer 410 is provided in order to cancel out the effects of the multiplexer 220 included in the variable frequency oscillator 200. The multiplexer 410 is configured as a replica of the multiplexer 220. Specifically, the multiplexer 410 applies the same delay as that to be provided by the multiplexer 220 to the output injwb_dly of the delay line 406, thereby cancelling out the effects of the multiplexer 220.

The above-described embodiments have been described for exemplary purposes only and are by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Description has been made in the embodiments regarding an arrangement in which an edge of the reference clock CLK_REF is used as the injection edge. However, the present invention is not restricted to such an arrangement. Also, the reference clock CLK_REF may be multiplied and used.

Description has been made regarding the present invention with reference to the embodiments using specific terms. However, the above-described embodiments show only an aspect of the mechanisms and applications of the present invention for exemplary purposes only and are by no means intended to be interpreted restrictively. Rather, various modifications and various changes in the layout can be made without departing from the spirit and scope of the present invention defined in appended claims.

DOCUMENT LIST

Patent Document List (1) Japanese Patent Application Laid Open No. 2014-154973

Non Patent Document List (1) F. u. Rahman, G. Taylor and V. Sathe, "A 1-2 GHz Computational-Locking ADPLL With Sub-20-Cycle Locktime Across PVT Variation", IEEE Journal of Solid-State Circuits
(2) K. Okuno, K. Masaki, S. Izumi, T. Konishi, H. Kawaguchi and M. Yoshimoto, "A 2.23 ps RMS jitter 3 μs fast settling ADPLL using temperature compensation PLL controller", 2014 21st IEEE International Conference on Electronics, Circuits and Systems (ICECS), Marseille, 2014, pp. 68-71
(3) C. Chung and C. Ko, "A Fast Phase Tracking ADPLL for Video Pixel Clock Generation in 65 nm CMOS Technology", IEEE Journal of Solid-State Circuits, vol. 46, no. 10, pp. 2300-2311, October 2011
(4) S. Hoppner, S. Haenzsche, G. Ellguth, D. Walter, H. Eisenreich and R. Schuffny, "A Fast-Locking ADPLL With Instantaneous Restart Capability in 28-nm CMOS Technology", IEEE Transactions on Circuits and Systems II: Express Briefs, vol. 60, no. 11, pp. 741-745, November 2013
(5) J. Lin and C. Yang, "A Fast-Locking All-Digital Phase-Locked Loop With Dynamic Loop Bandwidth Adjustment", IEEE Transactions on Circuits and Systems I: Regular Papers, vol. 62, no. 10, pp. 2411-2422, October 2015
(6) Y. Ho and C. Yao, "A Low-Jitter Fast-Locked All-Digital Phase-Locked Loop With Phase-Frequency-Error Compensation", IEEE Transactions on Very Large Scale Integration (VLSI) Systems, vol. 24, no. 5, pp. 1984-1992, May 2016
(7) C. Wu, W. Shen, W. Wang and A. Wu, "A Two-Cycle Lock-In Time ADPLL Design Based on a Frequency Estimation Algorithm", IEEE Transactions on Circuits and Systems II: Express Briefs, vol. 57, no. 6, pp. 430-434, June 2010
(8) R. B. Staszewski and P. T. Balsara, "All-Digital PLL With Ultra Fast Settling", IEEE Transactions on Circuits and Systems II: Express Briefs, vol. 54, no. 2, pp. 181-185, February 2007
(9) K. Okuno, S. Izumi, T. Konishi, S. Dae-Woo, M. Yoshimoto and H. Kawaguchi, "Temperature compensation using least mean squares for fast settling all-digital phase-locked loop", 2013 IEEE 11th International New Circuits and Systems Conference (NEWCAS), Paris, 2013, pp. 1-4

(10) K. J. Shen et al., "A 0.17-to-3.5 mW 0.15-to-5 GHz SoC PLL with 15 dB built-in supply noise rejection and self-bandwidth control in 14 nm CMOS", 2016 IEEE International Solid-State Circuits Conference (ISSCC), San Francisco, CA, 2016, pp. 330-331

(11) F. Ahmad et al. "A 0.5-9.5-GHz, 1.2-us Lock-Time Fractional-N DPLL With ±1.25% UI Period Jitter in 16-nm CMOS for Dynamic Frequency and Core-Count Scaling", IEEE Journal of Solid-State Circuits, vol. 52, no. 1, pp. 21-32, January 2017

What is claimed is:

1. A PLL circuit structured as a Phase Locked Loop (PLL) circuit, comprising:
   a digitally controlled oscillator structured such that, during a period in which a selection signal is asserted, a ring oscillator is formed so as to oscillate at a frequency that is changed based on a control code, and such that, during a period in which the selection signal is negated, an injection edge based on a reference clock can be injected; and
   a controller structured to control the digitally controlled oscillator,
   wherein (A) in a startup period of the PLL circuit, the controller is set to a first mode, and repeats a cycle comprising (i) a process in which the selection signal is asserted so as to oscillate the digitally controlled oscillator, and phase comparison is made between an oscillator clock generated by the digitally controlled oscillator and the reference clock, and (ii) a process in which the selection signal is negated so as to stop the digitally controlled oscillator, and the control code is updated by a binary search based on a result of the phase comparison.

2. The PLL circuit according to claim 1, wherein, in the first mode, the controller switches the selection signal between assertion and negation for every cycle of the reference clock.

3. The PLL circuit according to claim 1, wherein, in response to a stop instruction of the PLL circuit, the control code is held in this stage,
   and wherein, in a next startup instruction of the PLL circuit, the controller immediately starts feedback control of the control code with the control code thus held as an initial value.

4. The PLL circuit according to claim 1, wherein (B) after completion of the binary search, the controller is set to a second mode so as to continuously operate the digitally controlled oscillator, the control code is changed such that a phase of the oscillator clock approaches a phase of the reference clock, and the selection signal is periodically negated.

5. The PLL circuit according to claim 4, wherein the controller comprises a window generator structured to receive an internal clock of the digitally controlled oscillator, and to cut out one pulse so as to generate a window signal,
   and wherein, in the second mode, the selection signal corresponds to the window signal.

6. A control method for a Phase Locked Loop (PLL) circuit, wherein the PLL circuit comprises a digitally controlled oscillator structured such that, during a period in which a selection signal is asserted, a ring oscillator is formed so as to oscillate at a frequency that is changed based on a control code, and such that, during a period in which the selection signal is negated, an injection edge based on a reference clock can be injected,
   and wherein the control method comprises:
      a startup step in which, when the PLL circuit is started up a first time, the PLL circuit repeats a cycle comprising (i) a first process in which the selection signal is asserted so as to oscillate the digitally controlled oscillator, and phase comparison is made between an oscillator clock generated by the digitally controlled oscillator and the reference clock, and (ii) a second process in which the selection signal is negated so as to stop the digitally controlled oscillator, and the control code is updated by a binary search based on a result of the phase comparison; and
      a step in which, after completion of the binary search, the digitally controlled oscillator is continuously operated, and the control code is changed such that a phase of the oscillator clock approaches a phase of the reference clock.

7. The control method according to claim 6, wherein, in the startup step, the selection signal is switched between assertion and negation for every cycle of the reference clock.

8. The control method according to claim 6, further comprising:
   a step in which, in response to a stop instruction of the PLL circuit, the control code in this stage is held; and
   a step in which, when a next startup instruction of the PLL circuit is received, the digitally controlled oscillator immediately starts oscillation with a frequency that corresponds to the control code thus held as an initial frequency.

* * * * *